(12) United States Patent
Sasaki et al.

(10) Patent No.: US 8,498,141 B2
(45) Date of Patent: Jul. 30, 2013

(54) NON-VOLATILE SEMICONDUCTOR MEMORY DEVICE

(75) Inventors: Takahiko Sasaki, Tokyo (JP); Mizuki Uda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 146 days.

(21) Appl. No.: 13/051,312

(22) Filed: Mar. 18, 2011

(65) Prior Publication Data

US 2011/0235397 A1    Sep. 29, 2011

(30) Foreign Application Priority Data

Mar. 24, 2010 (JP) .................................. 2010-67780
Sep. 9, 2010 (JP) .................................. 2010-201695

(51) Int. Cl.
*G11C 11/00* (2006.01)

(52) U.S. Cl.
USPC ........ 365/148; 365/226; 365/242; 365/210.12

(58) Field of Classification Search
USPC .............................. 365/148, 226, 242, 210.12
See application file for complete search history.

(56) References Cited

U.S. PATENT DOCUMENTS

| | | | | |
|---|---|---|---|---|
| 6,671,208 B2 * | 12/2003 | Sumitani et al. | ......... | 365/185.23 |
| 6,940,772 B1 * | 9/2005 | Horch et al. | ............. | 365/210.12 |
| 7,292,471 B2 | 11/2007 | Sakimura et al. | | |
| 7,345,907 B2 * | 3/2008 | Scheuerlein | .................. | 365/148 |
| 7,447,057 B2 * | 11/2008 | Tsuji | ............................. | 365/148 |
| 7,885,132 B2 * | 2/2011 | Kubo et al. | .................... | 365/211 |
| 7,893,711 B2 * | 2/2011 | Kaeriyama et al. | ............. | 326/38 |
| 7,920,407 B2 * | 4/2011 | Chen et al. | .................... | 365/148 |
| 7,929,344 B2 * | 4/2011 | Maejima | ................... | 365/185.03 |
| 7,978,497 B2 | 7/2011 | Maejima | | |
| 8,023,313 B2 * | 9/2011 | Toda | .............................. | 365/148 |
| 8,094,481 B2 * | 1/2012 | Katoh et al. | .................. | 365/148 |
| 8,144,499 B2 * | 3/2012 | Kitagawa et al. | ............. | 365/148 |
| 2008/0258129 A1 | 10/2008 | Toda | | |
| 2011/0235395 A1 * | 9/2011 | Kobayashi et al. | ........... | 365/148 |

FOREIGN PATENT DOCUMENTS

JP    2009-217908    9/2009

OTHER PUBLICATIONS

Office Action issued Jun. 5, 2012, in Japanese Patent Application No. 2010-067780 with English-language translation.
U.S. Appl. No. 12/885,013, filed Sep. 17, 2010, Hiroshi Kanno et al.
U.S. Appl. No. 12/885,815, filed Sep. 20, 2010, Takahiko Sasaki.
U.S. Appl. No. 12/885,881, filed Sep. 20, 2010, Kazuaki Kawaguchi et al.

* cited by examiner

*Primary Examiner* — Viet Q Nguyen
(74) *Attorney, Agent, or Firm* — Oblon, Spivak, McClelland, Maier & Neustadt, L.L.P.

(57) ABSTRACT

A memory cell array includes a memory cell having a variable resistance element and disposed between first and second wirings. A control circuit provides a selected first wiring with a first voltage and provide a selected second wiring with a second voltage having a lower voltage value than the first voltage. A current limitation circuit controls a cell current below a first current. It includes a first current generation circuit for storing a cell current at a first point of time and generating a first current of α times the stored cell current. It also includes a second current generation circuit for generating a second current of (β/α) times the cell current at a second point of time. A determination circuit outputs a control signal when the second current exceeds the stored current. The first current generation circuit newly stores a stored current according to the control signal.

18 Claims, 9 Drawing Sheets

NON-VOLATILE SEMICONDUCTOR MEMORY DEVICE

CROSS REFERENCE TO RELATED APPLICATIONS

This application is based on and claims the benefit of priority from prior Japanese Patent Application No. 2010-201695, filed on Sep. 9, 2010, and prior Japanese Patent Application No. 2010-67780, filed on Mar. 24, 2010, the entire contents of which are incorporated herein by reference.

FIELD

Embodiments described herein relate to a non-volatile semiconductor memory device.

BACKGROUND

As a successor to the flash memory, a resistive memory device including a variable resistance element as a memory element has recently drawn attention. Here, the resistive memory device shall include several kinds of devices including resistive RAM (ReRAM) in a narrow sense, and the phase change RAM (PCRAM). The ReRAM includes, as the recording layer, a transition metal oxide and stores its resistance state in a non-volatile manner. The PCRAM includes, as the recording layer, a material such as chalcogenide and uses the resistance information of its crystal state (conductor) and amorphous state (insulator).

The resistive memory device is classified into a bipolar type and a unipolar type. The bipolar resistive memory device sets the high resistance state and the low resistance state by switching the polarity of the applied voltage. In contrast, the unipolar resistive memory device sets the high resistance state and the low resistance state by controlling the applied voltage value and the voltage application time without switching the polarity of the voltage.

DETAILED DESCRIPTION

Figure 1:
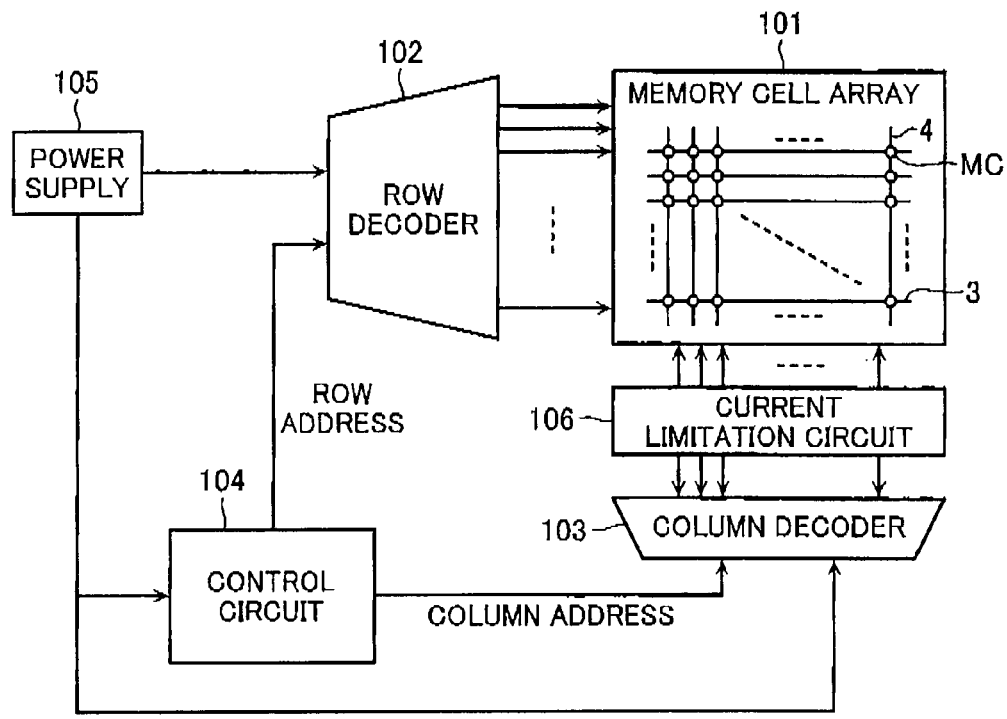
FIG. 1 is a block diagram of a resistive memory device according to a first embodiment.

In the non-volatile semiconductor memory devices according to the embodiments described below, a memory cell array includes memory cells. The memory cells include a variable resistance element and are disposed between a plurality of first wirings and a plurality of second wirings, respectively. A control circuit provides a selected first wiring with a first voltage and provide a selected second wiring with a second voltage having a lower voltage value than the first voltage. A current limitation circuit controls a cell current flowing through the selected memory cell not to exceed a first current. The current limitation circuit includes a first current generation circuit configured to store a cell current at a first point of time as a stored current and generating a first current having a current value of $\alpha$ times the current value of the stored current, and a second current generation circuit configured to generate a second current having a current value of $(\beta/\alpha)$ $(\alpha > \beta)$ times the current value of a cell current at a second point of time after the first point of time. A determination circuit outputs a control signal when it determines that the current value of the second current exceeds the current value of the stored current. The first current generation circuit newly stores a stored current at a timing according to the control signal.

Referring now to the drawings, a resistive memory device according to embodiments will be described below.

[First Embodiment]

FIG. 1 is a block diagram of a resistive memory device according to a first embodiment. The resistive memory device includes a memory cell array 101, the memory cell array 101 including a memory cell able to store data, a row decoder 102, a column decoder 103, a control circuit 104 for controlling the entire resistive memory device, a voltage generation circuit 105, and a current limitation circuit 106.

The memory cell array 101 includes a plurality of word-lines 3, a plurality of bit-lines 4 intersecting with the word-lines 3, and memory cell MCs disposed between the word-lines 3 and the bit-lines 4. The row decoder 102 receives a row address from the control circuit described below and selects a word-line 3 corresponding to the row address. In contrast, the column decoder 103 receives a column address from the control circuit described below and selects a bit-line 4 corresponding to the column address. In this way, a memory cell MC as an object of reading or writing is selected from the memory cell array 101.

The control circuit 104 provides the row decoder 102 and the column decoder 103 with a row address and a column address, respectively, to select a memory cell MC for reading and writing in the memory cell array 101.

The control circuit 104 controls, according to the state of the memory cell that is selected (which may hereinafter be referred to as a selected memory cell) MC, the operation of the selected memory cell MC. The voltage generation circuit 105 generates certain types of voltages corresponding to the respective operations of forming, writing, erasing, and reading. The voltage generation circuit 105 then supplies the certain types of voltages to the row decoder 102, the column decoder 103, and the control circuit 104.

The memory cell is written with data by applying the variable resistance element with a certain voltage for a short time period. The variable resistance element thus changes from the high resistance state to the low resistance state. The operation of changing the variable resistance element from the high resistance state to the low resistance state may hereinafter be referred to as a set operation. Data in the memory cell is erased by applying the variable resistance element in the low resistance state after the set operation with a certain voltage lower than that in the set operation for a long time period. The variable resistance element thus changes from the low resistance state to the high resistance state. The operation of changing the variable resistance element from the low resistance state to the high resistance state may hereinafter be referred to as a reset operation. If, for example, the memory cell uses the high resistance state as the stable state (reset state) and provides binary data storage, the memory cell is written with data by the set operation of changing the reset state to the low resistance state.

The variable resistance element has, immediately after the manufacture, a too high resistance to be easily changed. A forming operation is thus performed of applying the variable resistance element with a high voltage. The forming operation allows the resistance of the variable resistance element to change between the high resistance state and the low resistance state, allowing the variable resistance element to operate as a memory cell.

In the resistive memory device, immediately after the memory cell is changed to the low resistance state, the memory cell may conduct an excess current. The excess current may cause problems such as a wrong reset operation where the memory cell that has completed the set operation accidentally returns to the reset state, and a memory cell breakdown. The forming operation also meets similar problems.

The current limitation circuit 106 has, therefore, a function of controlling, when a set voltage VSET is applied via a column decoder 103 in the set operation, the cell current Icell flowing through the memory cell MC in the set operation not to exceed the certain upper limit current (compliance current Icomp).

Figure 2:
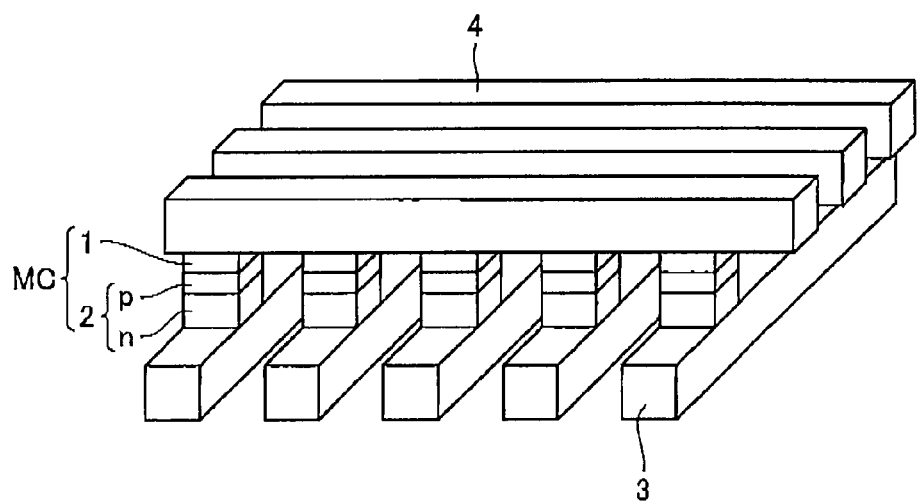
FIG. 2 is a perspective view of a portion of a memory cell array 101 of a resistive memory device according to the first embodiment.

FIG. 2 is a perspective view of a portion of the memory cell array 101 shown in FIG. 1. The memory cell array 101 includes a plurality of word-lines 3 disposed in parallel, a plurality of bit-lines 4 disposed perpendicular to the word-lines 3, and a unipolar memory cell MC disposed between the word-lines 3 and the bit-lines 4, the unipolar memory cell MC being sandwiched by the word-lines 3 and the bit-lines 4, as viewed from the top.

The memory cell MC includes a variable resistance element 1 that changes between at least two resistance states including the low resistance state and the high resistance state, and a selection device including a non-ohmic device, such as a diode 2. Note that the present invention is not limited to the unipolar memory cell MC, and it is also applicable to a resistive memory device including the bipolar memory cell MC. The resistive memory device according to the embodiment shown in FIG. 2 has a so-called cross-point configuration.

In the memory cell array of the configuration shown in FIG. 2, the word-lines 3 and the bit-lines 4 provide a simple line-and-space pattern. The word-lines 3 and the bit-lines may have a positional relationship in which they are perpendicular to each other. It is thus not necessary to consider a misalignment between the extending direction of the word-lines 3 and the extending direction of the bit-lines 4. In the manufacturing process, therefore, the memory cell array 101 may have a very low alignment accuracy, thereby facilitating the manufacture.

The variable resistance element 1 includes devices such as PCRAM, CBRAM, and ReRAM, as described below. The PCRAM includes a material such as chalcogenide and changes its resistance using phase transition between the crystal state and the amorphous state of the material. The CBRAM changes its resistance using precipitation of metal cation to form a cross-linking (contacting bridge) between the electrodes, and ionization of the precipitated metal to break down the cross-linking. The ReRAM changes its resistance by application of a voltage or current. The ReRAM may be broadly classified into two types: a first type in which the resistance is changed by the presence or absence of charges trapped by charge traps at the electrode interface; and a second type in which the resistance is changed by the presence or absence of a conductive path due to oxygen deficiency and so on. The ReRAM may include materials such as $ZnMn_2O_4$, $NiO$, $TiO_2$, $SrZrO_3$, and $Pr_{0.7}Ca_{0.3}MnO$.

The variable resistance element 1 has, immediately after the manufacture, a too high resistance to be easily changed. To allow the variable resistance element 1 to perform various operations as the memory cell MC, the variable resistance element 1 is provided with the forming operation. The forming operation applies the variable resistance element 1 with a forming voltage Vform (4 V or more) to conduct a large current through the variable resistance element 1. The large current forms a filament path (current path) in the variable resistance element 1. A certain voltage applied to the memory cell MC expands or contracts the filament path. The variable resistance element 1 may thus be able to change between the low resistance state and the high resistance state.

In the unipolar ReRAM, the memory cell MC is written with data by applying the variable resistance element 1 with a set voltage VSET of for example 3.5 V (actually about 4.5 V including the voltage drop across the diode 2) to conduct a current of about 10 nA for a time period of about 10 ns-100 ns. The variable resistance element 1 thus changes from the high resistance state to the low resistance state (set operation).

Data of the memory cell MC is erased by applying the variable resistance element 1 in a low resistance state after the set operation with a reset voltage VRESET of 0.8 V (actually about 2.0 V including the voltage drop across the diode 2) to conduct a current of about 1 μA-10 μA for a time period of about 500 ns-2 μs. The variable resistance element 1 thus changes from the low resistance state to the high resistance state (reset operation).

Data of the memory cell MC is read by applying the variable resistance element 1 with a read voltage VREAD of 0.4 V (actually about 1.4 V including the voltage drop across the diode 2) and by monitoring the current flowing through the variable resistance element 1 with a sense amplifier. It is thus determined whether the variable resistance element 1 is in the low resistance state or in the high resistance state.

With reference to FIG. 1, the bit-lines 4 of the memory cell array 101 are applied, according to the address from the control circuit 104, with the voltages (Vform, VSET, VRESET, and VREAD) corresponding to the respective above operations via the column decoder 103.

The set operation on the memory cell MC provides a variation of the resistance of the variable resistance element between the memory cells MC. Setting the same fixed compliance current Icomp for the whole memory cells MC will thus result in problems such as a wrong reset operation, a memory cell MC breakdown, and a set operation failure, making it difficult to appropriately perform the set operation.

In contrast, in the first embodiment, the current limitation circuit 106 controls the cell current Icell flowing through each memory cell MC not to exceed the compliance current Icomp individually set for each memory cell MC in question, thereby providing the appropriate set operation. The compliance current Icomp is set to a current α*Icell_previous (first current) having a current value of α times the cell current Icell_previous (stored current) at a certain point of time. α is larger than β described below (α>β), β is larger than 1 (one) (β>1). Specifically, β/α is less than 1 (one).

Figure 3:
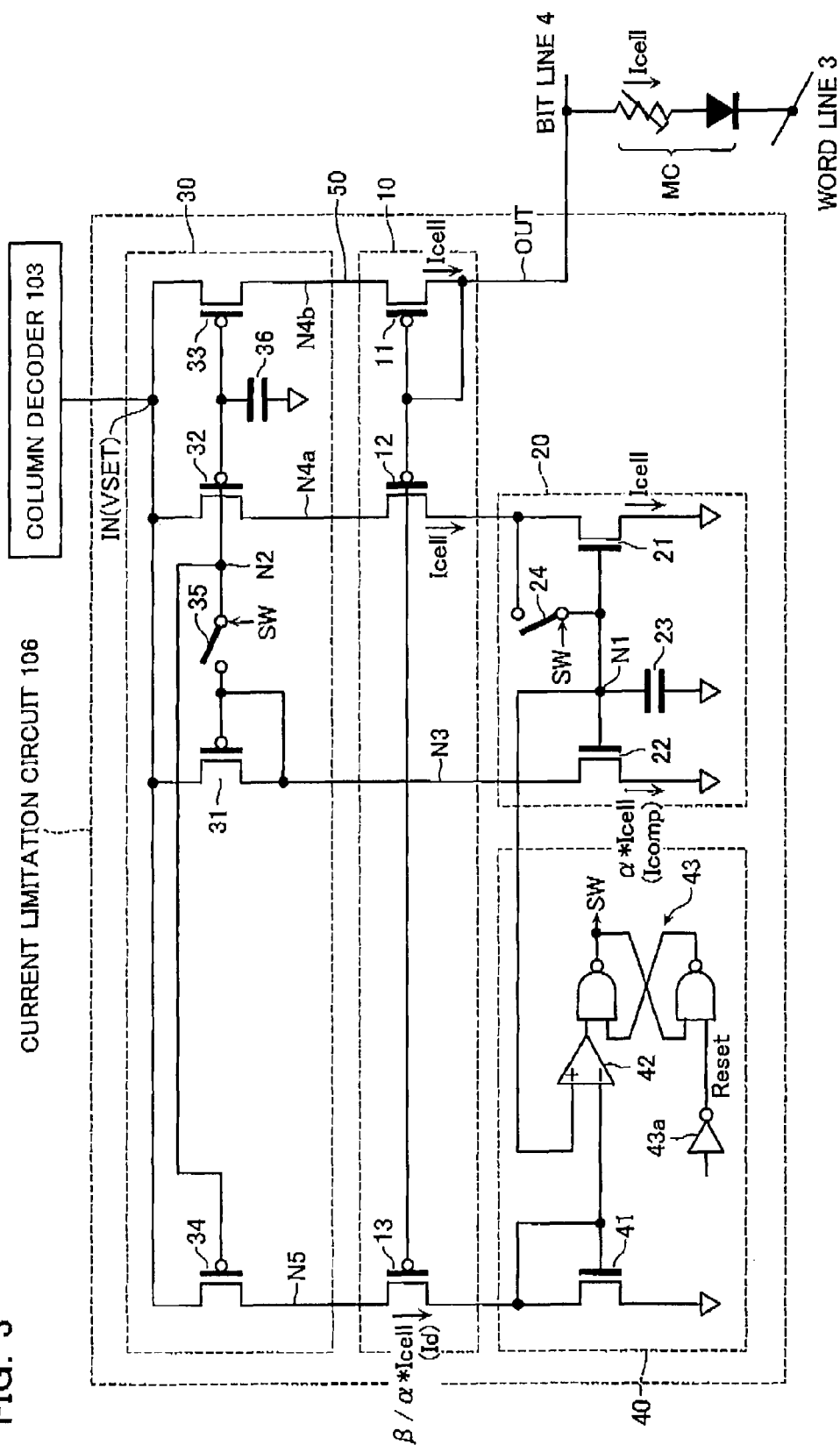
FIG. 3 shows a circuit diagram of a current limitation circuit 106 of a resistive memory device according to the first embodiment.

FIG. 3 is a circuit diagram of the current limitation circuit 106 of a resistive memory device according to the first embodiment.

With reference to FIG. 3, the current limitation circuit 106 has a function of controlling the cell current Icell not to exceed the compliance current Icomp as described above.

In addition, the current limitation circuit 106 is adapted to appropriately control the cell current Icell by incrementing the compliance current Icomp every time the cell current Icell reaches the vicinity of the compliance current Icomp. In this case, it is important to appropriately control the timing of the incrementation of the compliance current Icomp. The current limitation circuit 106 is adapted to determine the above timing by comparing the compliance current Icomp (=α*Icell_previous) with a current β*Icell. The current β*Icell has a current value of β times the cell current Icell (β>1). The method of controlling the timing by the current limitation circuit 106 will be specifically described below.

With reference to FIG. 3, the input node IN of the current limitation circuit 106 is supplied with the set voltage VSET necessary for the set operation of the memory cell MC and other signals from the column decoder 103. The output node OUT is connected to the bit-line 4. The current limitation circuit 106 includes current mirror circuits 10 to 30 and a determination circuit 40.

The current mirror circuit 10 generates a determination current Id (=β/α*Icell) (a second current) having a current value of a certain constant β/α times the current value of the cell current Icell. The current mirror circuit 10 includes PMOS transistors 11 to 13.

The PMOS transistor 11 is connected between the input node IN and the output node OUT, forming a current path 50 between the input and output nodes. The PMOS transistor 11 is also diode-connected. The PMOS transistors 12 and 13 and the PMOS transistor 11 share the same gate. The PMOS transistor 12 has the same size as the PMOS transistor 11. The PMOS transistor 13 has β/α times the size of the PMOS transistor 11. The cell current Icell flowing through the PMOS transistor 11 is thus mirrored to the PMOS transistors 12 and 13, the PMOS transistor 12 conducts the cell current Icell, the PMOS transistor 13 conducts the determination current Id (=β/α*Icell) having a current value of β/α times the cell current Icell.

The current mirror circuit 20 stores the cell current Icell_previous at a certain timing. The current mirror circuit 20 also generates the compliance current Icomp (=α*Icell_previous) having a current value of a certain constant α times the current value of the stored cell current Icell_previous. The current mirror circuit 20 having the above function includes NMOS transistors 21 and 22, a capacitor 23, and a switch 24.

The NMOS transistor 21 has its drain connected to the drain of the PMOS transistor 12, and its source connected to the ground terminal. The NMOS transistor 22 has its gate connected to the gate (node N1) of the NMOS transistor 21, and its source grounded. The NMOS transistor 22 has α(α>1) times the size of the NMOS transistor 21. The capacitor 23 has a first end connected to the node N1 and a second end connected to the ground terminal. The switch 24 is connected between the gate and drain of the PMOS transistor 21. The switch 24 is switched between the short-circuited state and the disconnected state by a switching signal SW described below.

In response to a switching signal SW of "H," the switch 24 is rendered conductive at a certain point of time to perform the mirror operation of the current mirror circuit 20. The transistor 21 conducts the cell current Icell. The capacitor 23 is then charged according to the cell current Icell. When the switch 24 is conductive, a switch 35 described below is complementarily non-conductive. The switch 24 is then rendered non-conductive and the switch 35 is rendered conductive. The voltage across the capacitor 23 causes, however, a certain compliance current Icomp (=αIcell_previous) through the NMOS transistor 22. The compliance current Icomp is mirrored by the current mirror circuit 30 to the current path 50 to limit the cell current Icell flowing through the memory cell MC. The compliance current Icomp has a value in proportion to the cell current Icell_previous through the selected memory cell MC at a certain timing. A current control is thus possible that reflects the different characteristics between the memory cells MC.

The current path 50 supplies the set voltage Vset to the bit-lines BL. The current mirror circuit 30 provides the current path 50 with a current limited to be equal to or less than the compliance current Icomp. The upper limit of the cell current Icell flowing through the memory cell MC is thus controlled to be equal to or less than the current value of the compliance current Icomp. The current mirror circuit 30 having the above function includes PMOS transistors 31 to 34, a switch 35, and a capacitor 36.

The PMOS transistors 31 to 34 each have their sources connected to the input node IN. The PMOS transistor 31 has its gate adapted to be connectable to a node N2 via the switch 35. The PMOS transistors 32 to 39 have their gates commonly connected to the node N2. The PMOS transistor 31 has its drain connected to the drain of the transistor 22 at a node N3 and also connected to the gate of the PMOS transistor 31. The PMOS transistor 32 has its drain connected to the source of the PMOS transistor 12 at a node N4a. The PHOS transistor 33 has its drain connected to the source of the PMOS transistor 11 at a node N4b. The PMOS transistor 34 has its drain connected to the source of the PMOS transistor 13 at a node N5. The switch 35 is connected between the gate of the PMOS transistor 31 and the node N2. The switch 35 is switched between the short-circuited state and the disconnected state by the switching signal SW. In other words, the switch 35 is adapted to disconnect the mirror connection of the current mirror circuit 30. The capacitor 36 is provided between the commonly connected gates of the PMOS transistors 32 and 33 and the ground terminal.

The switch 35 is conductive unless the switch 24 is conductive. The PMOS transistors 31 to 34 are thus current-mirror connected to each other, causing the current mirror circuit 30 to be in the mirror operation. The compliance current Icomp due to the voltage across the capacitor 23 may thus flow through the current path 50, thereby charging the capacitor 36 at the same time. On the other hand, while the switch 35 is conductive, the switch 29 is complementarily non-conductive. According to a switching signal SW of "H," the switch 35 is rendered non-conductive at a certain point of time. The voltage across the capacitor 36 allows, however, a certain current to flow through the current path 50.

The determination circuit 40 outputs a switching signal SW of "H" to switch the conduction state of the switches 24 and 35 when the circuit 40 determines that the current value of the determination current Id (=β/α*Icell) exceeds the current value of the cell current Icell_previous stored in the capacitor 23. That is, when the determination circuit determines that the compliance current Icomp (=α*Icell_previous) is exceeded by the current β*Icell of β times the cell current Icell, the determination circuit 40 outputs a switching signal SW of "H".

The determination circuit 40 having the above function includes an NMOS transistor 41, an operational amplifier (differential amplifier) 42, a latch circuit 43, and an inverter 43a.

The NMOS transistor 41 is diode-connected between the drain of the PMOS transistor 13 and the ground terminal. The NMOS transistor 41 has the same size as the NMOS transistor 21. The operational amplifier 42 has a non-inverting input terminal connected to the gate of the NMOS transistor 41. The operational amplifier 42 also has an inverting input terminal connected to the node N1. Specifically, the operational amplifier 42 compares the voltage across the capacitor 23 (the voltage due to the stored cell current Icell) with the voltage due to the determination current Id. The latch circuit 43 has an input terminal connected to the output terminal of the operational amplifier 42. The latch circuit 43 receives a reset signal Reset. The latch circuit 43 stores data according to the output signal from the operational amplifier 42. The latch circuit 43 erases stored data in response to the reset signal Reset supplied via the inverter 43a.

Figure 4:
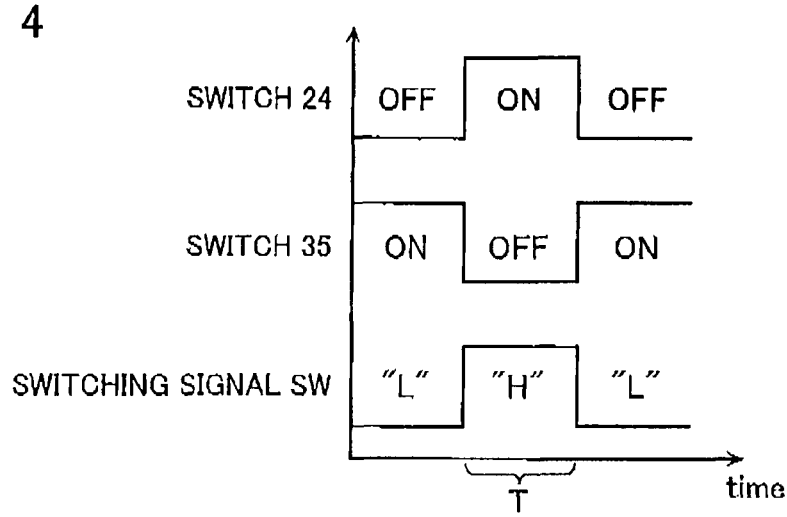
FIG. 4 shows the states of a switching signal SW and switches 24 and 35.

Referring now to FIG. 4, a description is given of the switching signal SW and the conduction state of the switches 24 and 35 according to the signal SW.

With reference to FIG. 4, the switching signal SW is usually at "L," the switch 24 is non-conductive, and the switch 35 is conductive. When it is determined that the determination current Id exceeds the cell current Icell_previous stored in the capacitor 23, the switching signal SW changes from "L" to "H." Then, in response to the reset signal Reset, the switching signal SW changes again from "H" to "L." Specifically, the switching signal SW rises in a pulsed manner for time T. For time T, the switch 24 changes from the non-conductive state to the conductive state, and the switch 35 changes from the conductive state to the non-conductive state. A cell current Icell_previous at a certain timing within time T is thus newly stored by the capacitor 23.

Figure 5:
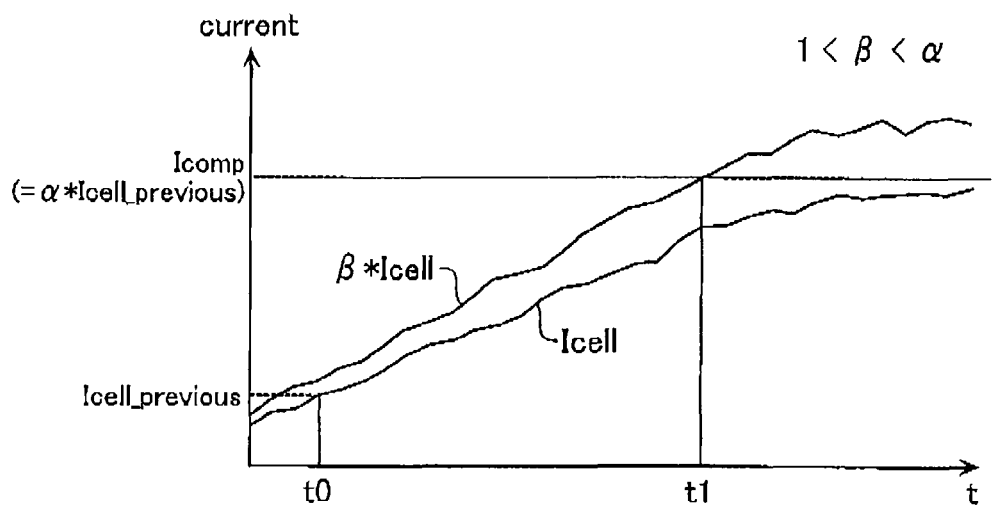
FIG. 5 shows current values of a cell current Icell.
Figure 6:
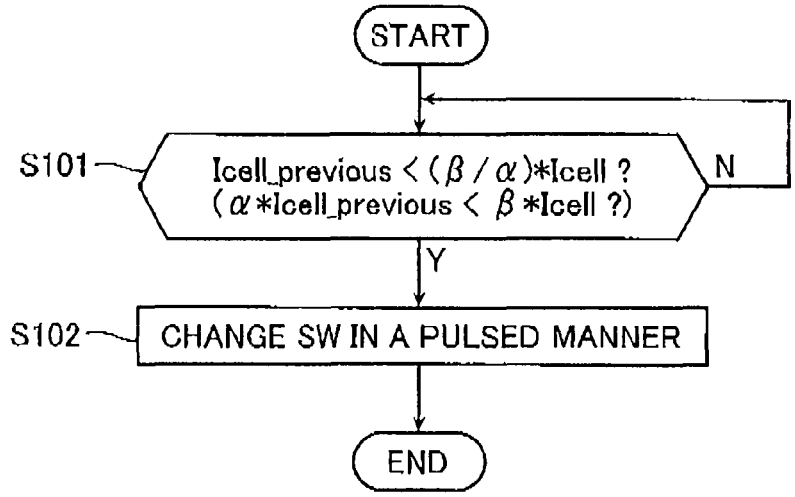
FIG. 6 is a flowchart of the operation of a resistive memory device according to the first embodiment.

Referring now to FIG. 5 and FIG. 6, the control of the switching signal SW will be described below. With reference to FIG. 5, in the first embodiment, the current limitation circuit 106 first raises, at time t0, the switching signal SW for time T, and thus stores the cell current Icell_previous, and according to the cell current, generates the compliance current Icomp (=α*Icell_previous). After time t0, the resistance of the variable resistance element 1 decreases, thereby increasing the current value of the cell current Icell as shown in FIG. 5.

After time t0, the current limitation circuit 106 determines whether the current β*Icell having a current value of β times the cell current Icell exceeds the compliance current Icomp (=α*Icell_previous) (FIG. 6, at step S101). Specifically, at step S101, the current limitation circuit 106 determines, with the determination circuit 40 shown in FIG. 3, whether the determination current Id (=β/α)*Icell) exceeds the stored cell current Icell_previous.

For example, before time t1 as shown in FIG. 5, the current limitation circuit 106 determines that the determination current Id is equal to or less than the stored cell current Icell_previous (the current β*Icell is equal to or less than the current α*Icell_previous) (FIG. 6, at step S101, N), and performs the repeating process at step S101. At time t1 as shown in FIG. 5, the current limitation circuit 106 determines that the determination current Id is larger than the stored cell current Icell_previous (the current β*Icell is larger than the current α*Icell_previous) (FIG. 6, at step S101, Y), and performs the process at step S102 as described below.

The current limitation circuit 106 changes, at step S102, the switching signal SW for time T in a pulsed manner as shown in FIG. 4. A current Icell_previous at a certain timing within time T cell is thus newly stored. After step S102, the compliance current Icomp according to the newly stored cell current Icell_previous limits the cell current Icell. Thus, in the first embodiment, when it is determined that the current value of the determination current Id exceeds the current value of the stored cell current Icell_previous, the process of outputting the switching signal SW of "H" is performed only once.

In the first embodiment, the current limitation circuit 106 may control, when the set voltage VSET is applied via the column decoder 103 in the set operation, the cell current Icell flowing through the memory cell MC in the set operation not to exceed the certain upper limit current (the compliance current Icomp). In the first embodiment, therefore, the wrong reset operation, the memory cell breakdown, and so on may be suppressed.

In the memory cells including variable resistance elements, it is hard to provide uniform characteristics across the variable resistance elements, and the resistance of the variable resistance element is varied, for example, before and after the set operation completion for each memory cell. Setting the same compliance current for the entire memory cell thus makes it hard to perform the set operation appropriately while suppressing the wrong reset operation and the memory cell breakdown.

In the first embodiment, therefore, the cell current Icell_previous may be stored at a certain timing, and the compliance current Icomp (=α*Icell_previous) having a current value of α times the current value of the stored cell current Icell_previous may be set. In the first embodiment, the set operation may thus be accurately performed at an appropriate timing for each cell.

Now consider a comparative example of controlling the timing at which the cell current Icell_previous is stored according to a common clock signal between a plurality of memory cells. In such a comparative example, it is hard to control the timing of setting the compliance current Icomp to be different for each memory cell MC. For the memory cell MC that has already reached the compliance current Icomp before the clock signal input, therefore, a useless waiting time occurs until the clock signal input. Also in such a comparative example, for the memory cell MC that has not reached the compliance current Icomp at the clock signal input, the current value of a newly set compliance current Icomp is not appropriate for the memory cell MC. Specifically, a malfunction may thus occur. Also in such a comparative example, the clock signal needs to be supplied to each of the current limitation circuits 106, and thus has a complicated wiring layout and higher power consumption.

In contrast, the power supply limitation circuit of the first embodiment generates the determination current Id having a current value of β/α times the current value of the cell current Icell (=β/α*Icell). The power supply limitation circuit of the first embodiment changes, when the current value of the determination current Id exceeds the current value of the stored cell current Icell_previous, the switching signal SW in a pulsed manner. At a certain timing according to the switching signal SW, a cell current Icell_previous is newly stored and a compliance current Icomp is newly set.

According to the above configuration, the first embodiment may set the compliance current Icomp again at an appropriate timing for each memory cell MC to solve a problem such as the comparative example. Also according to the above configuration, the first embodiment may provide a simpler wiring layout and less power consumption than the comparative example.

Note that the current mirror circuit 20 may be any circuit that may generate a current of a times the cell current Icell_previous at a certain timing and the circuit 20 is not limited to the circuit as shown in FIG. 3 or in other figures. The current mirror circuit 20 may be, for example, an amplification circuit that may amplify a current by a factor of $\alpha$. The determination circuit 40 may be, for example, a circuit that may compare the cell current $\beta$*Icell_previous with the compliance current Icell (=$\alpha$*Icell_previous).

[Second Embodiment]

Figure 7:
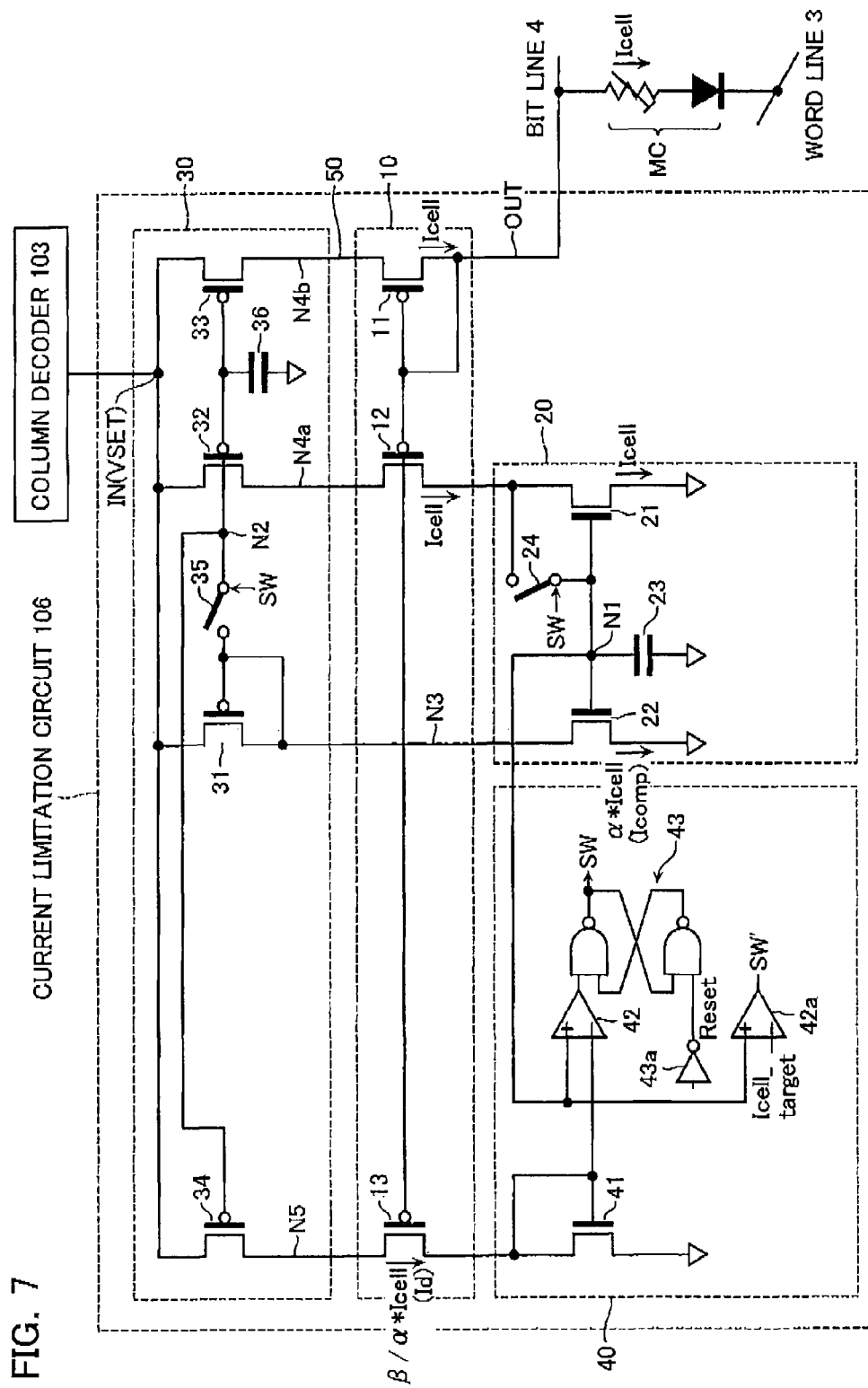
FIG. 7 is a circuit diagram of the current limitation circuit 106 of a resistive memory device according to a second embodiment.

Referring now to FIG. 7, the configuration of a resistive memory device according to a second embodiment will be described below. FIG. 7 is a circuit diagram of the current limitation circuit 106 according to the second embodiment.

The mirror circuit 20 according to the second embodiment performs, when it is determined that the current value of a sense current Id exceeds the current value of the stored cell current Icell, a process of outputting a switching signal SW of "H" more than once. To this extent, the second embodiment is different from the first embodiment in which the above process is performed only once. Note that in the second embodiment, like components as those in the first embodiment are designated with like reference numerals and their detailed description is omitted here.

In the resistive memory device according to the second embodiment, as shown in FIG. 7, only the configuration of the determination circuit 40 is different from that in the first embodiment. The determination circuit 40 includes, as shown in FIG. 7, the components in the first embodiment and additionally an operational amplifier 42a.

The operational amplifier 42a has an inverting input terminal connected to the node N1. The operational amplifier 42a also has a non-inverting input terminal supplied with a target signal Icell_target. The operational amplifier 42a compares the voltage across the charged capacitor 23 (the voltage due to the stored cell current Icell_previous) with the voltage of the target signal Icell_target and outputs a switching signal SW'. The target signal Icell_target defines the upper limit of the current value of the cell current Icell_previous. By switching the signal SW' from "L" to "H," the current limitation circuit 106 stops the voltage supply to the memory cell MC.

Figure 8:
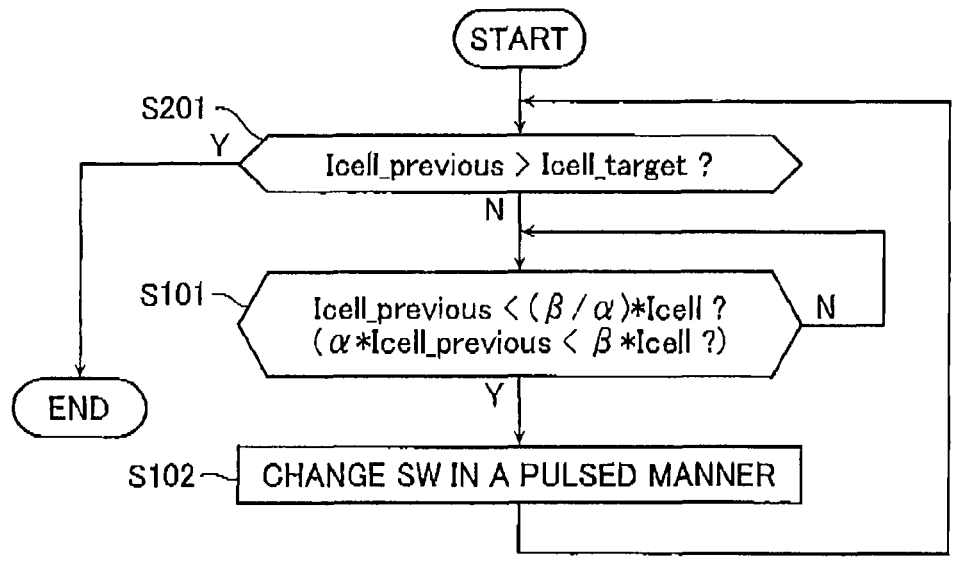
FIG. 8 is a flowchart of the operation of a resistive memory device according to the second embodiment.

Referring now to FIG. 8, the operation of a resistive memory device according to the second embodiment will be described below. The current limitation circuit 106 performs, as shown in FIG. 8, step S201 before the process at step S101 in the first embodiment. The current limitation circuit 106 determines, at step S201, whether the stored cell current Icell_previous is larger than the target current Icell_target. If the current limitation circuit 106 determines that the cell current Icell_previous is equal to or less than the target current Icell_target (at step S201, N), the circuit 106 performs the process at step S101. If the current limitation circuit 106 determines that the cell current Icell_previous is larger than the target current Icell_target (at step S201, Y), the circuit 106 changes the switching signal SW' from "L" to "H," and the set operation ends. Note that the current limitation circuit 106 performs again, after step S102, the process at step S201.

[Third Embodiment]

Figure 9:
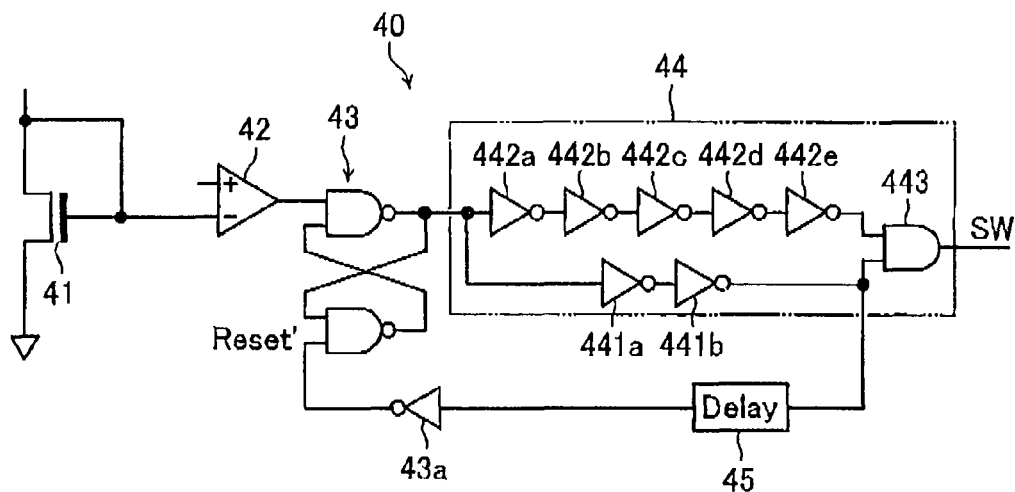
FIG. 9 is a circuit diagram of a determination circuit of a resistive memory device according to a third embodiment.

Referring now to FIG. 9, the configuration of a resistive memory device according to the third embodiment will be described below. FIG. 9 is a circuit diagram of the determination circuit 40 according to the third embodiment. Note that in the third embodiment, like components as those in the first and second embodiments are designated with like reference numerals and their detailed description is omitted here.

In the above first and second embodiments, the reset signal Reset supplied outside the determination circuit 40 is input to the latch circuit 43 to change the switching signal SW from "H" to "L" to change the switching signal SW in a pulsed manner. In contrast, in the third embodiment, unlike the first and second embodiments, the externally supplied reset signal Reset is not used to change the switching signal SW in a pulsed manner.

In the resistive memory device according to the third embodiment, as shown in FIG. 9, only the configuration of the determination circuit 40 is different from those in the first and second embodiments. The determination circuit 40 includes, as shown in FIG. 9, the components in the first embodiment and additionally a pulse signal generation circuit 44 and a delay circuit 45.

The pulse signal generation circuit 44 generates, in response to the output signal from the latch circuit 43, a switching signal SW in a pulsed manner. The pulse signal generation circuit 44 includes inverters 441a, 441b, and 442a to 442e, and an AND circuit 443.

The inverters 441a and 441b are connected in series. The inverter 441a has an input terminal connected to the output terminal of the latch circuit 43. Likewise, the inverters 442a to 442e are connected in series, and the inverter 442a has an input terminal connected to the output terminal of the latch circuit 43. The AND circuit 443 has a first input terminal connected to the output terminal of the inverter 441b. The AND circuit 443 has a second input terminal connected to the output terminal of the inverter 442e. The AND circuit 443 thus outputs, according to the logical AND of an input signal via the inverters 441a and 441b and an input signal delayed after that signal via the inverters 442a to 442e, a switching signal SW that changes in a pulsed manner.

The delay circuit 45 has an input terminal connected to the output terminal of the inverter 441b (the first input terminal of the AND circuit 443). The delay circuit 45 has an output terminal connected to the latch circuit 43 via the inverter 43a. The delay circuit 45 delays the output signal of the inverter 441b and supplies the delayed signal to the latch circuit 43 as a reset signal Reset'. In response to the reset signal Reset', data of the latch circuit 43 is erased.

Note that the operation of the current limitation circuit 106 according to the first to third embodiments is intended only for the current supply to the memory cell MC in the set operation. The current limitation circuit 106 and its operation may also accommodate, however, the current supply to the memory cell MC in the forming operation.

[Fourth Embodiment]

Figure 10:
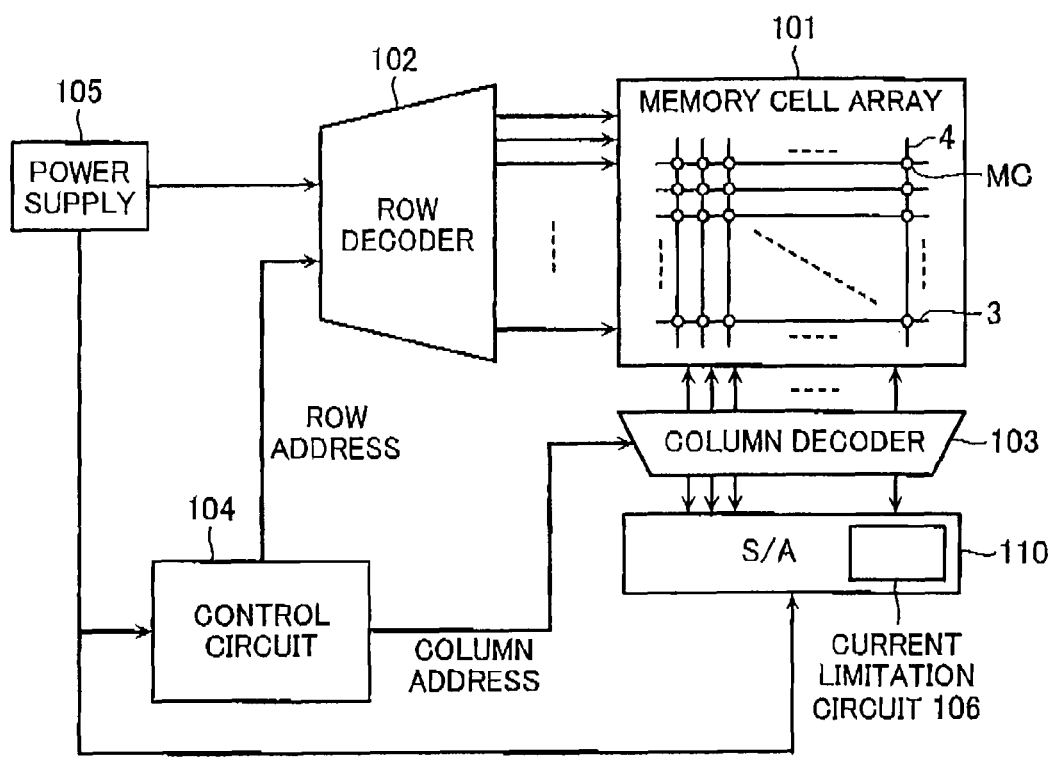
FIG. 10 is a block diagram of a non-volatile semiconductor memory device according to the fourth embodiment.

FIG. 10 is a block diagram of a semiconductor memory device according to a fourth embodiment. The semiconductor memory device includes a memory cell array 101, a row decoder 102, a column decoder 103, a control circuit 104, a power supply 105, and a sense amplifier circuit 110. The memory cell array 101, the row decoder 102, the column decoder 103, the control circuit 104, and the power supply 105 are the same as those in the first embodiment. The memory cell array MC may also be identical with that shown in FIG. 2.

The sense amplifier circuit 110 has a function of sensing the current flowing through the bit-lines 4 to determine data held by the memory cell MC. The sense amplifier circuit 110 also includes a current limitation circuit 106 provided therein. The current limitation circuit 106 has a function of controlling, in the set operation and in the forming operation, the cell current Icell flowing through the memory cell MC not to exceed the certain upper limit (limitation current Icomp).

With reference to FIG. 10, the bit-lines 4 of the memory cell array 101 are applied, according to the address from the control circuit 104, with voltages (VSET, VRESET, and VREAD) corresponding to the respective above operations via the column decoder 103.

Figure 11:
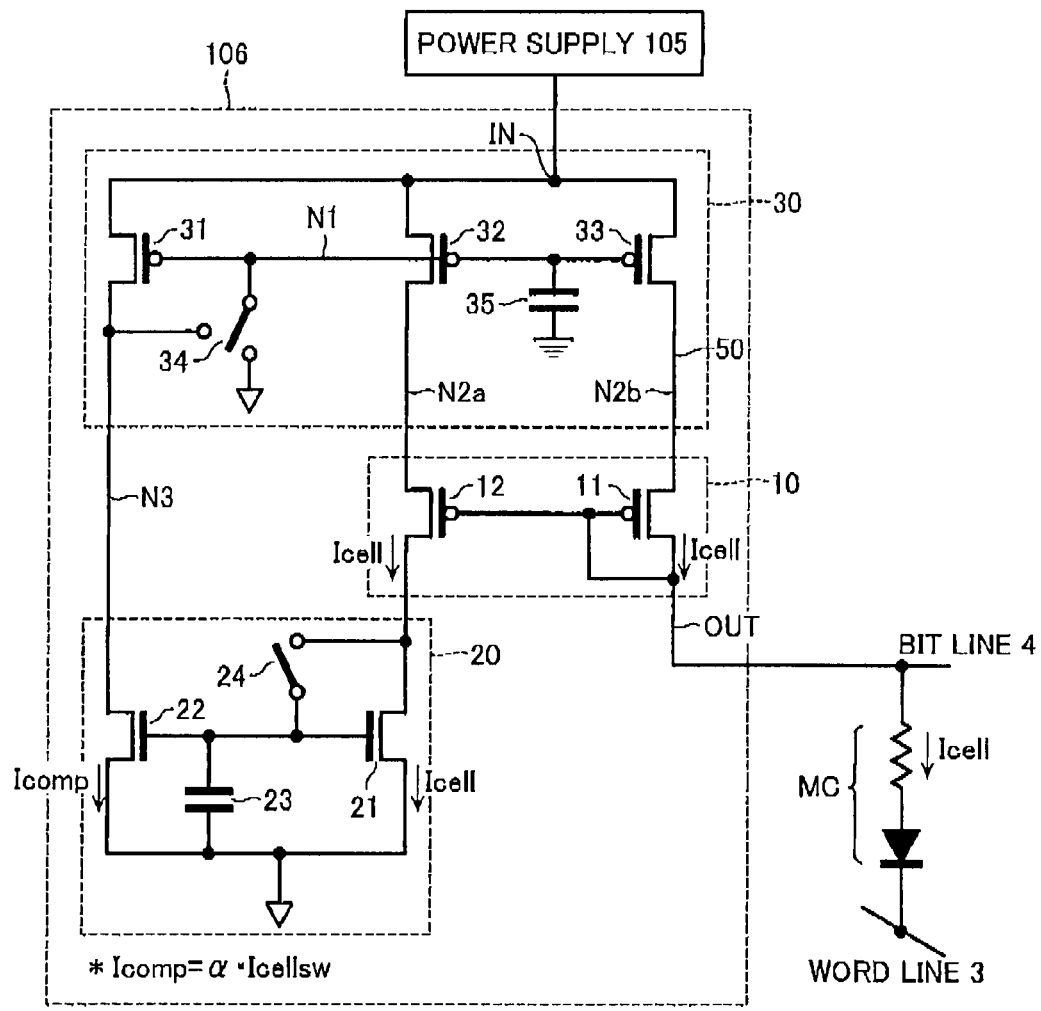
FIG. 11 is an equivalent circuit diagram of a specific example configuration of the current limitation circuit.

FIG. 11 is a circuit diagram of the current limitation circuit 106 of a semiconductor memory device according to the fourth embodiment. The input node IN of the current limitation circuit 106 is supplied, by the power supply 105, with the set voltage VSET necessary for the set operation of the memory cell MC, the reset voltage VRESET necessary for the reset operation, the forming voltage Vform necessary for the forming operation, and so on.

The output node OUT is connected to the bit-line BL. The current limitation circuit 106 includes the current mirror circuit 10, the current mirror circuit 20, and the current mirror circuit 30.

The current mirror circuit 10 includes the PMOS transistors 11 and 12. The PMOS transistor 11 is connected in the current path 50 between the input node IN and the output node OUT, forming a current path in the current path 50. The PMOS transistor 11 is also diode-connected. The PMOS transistor 12 and the PMOS transistor 11 share the same gate. The PMOS transistors 11 and 12 have the same size. The cell current Icell flowing through the PMOS transistor 11 is thus mirrored to the PMOS transistor 12.

The current mirror circuit 20 is a circuit that generates, according to the cell current Icell, a limitation current Icomp (first current). Specifically, the current mirror circuit 20 is a circuit that generates the limitation current Icomp ($=\alpha$*Icellsw) having a current value of a certain constant ($\alpha$) times the current value Icellsw of the cell current Icell at a certain timing. The current mirror circuit 20 includes NMOS transistors 21 and 22, a capacitor 23, and a switch 24.

The NMOS transistor 21 has its drain connected to the drain of the PMOS transistor 12. The NMOS transistor 21 also has its source connected to the ground terminal. The gate and drain of the NMOS transistor 21 are switched, by the switch 24, between the short-circuited state and the disconnected state.

The NMOS transistor 22 has its gate connected to the gate of the NMOS transistor 21. The NMOS transistor 22 has its source grounded. The NMOS transistor 22 has $\alpha$ times the size of the NMOS transistor 21. The capacitor 23 has a first end connected to the gates of the NMOS transistor 21 and 22, and a second end connected to the ground terminal.

The current mirror circuit 20 performs, when the switch 24 is conductive, the mirror operation to flow, according to the current Icell flowing through the transistor 21, the current Icomp ($=\alpha$*Icell) through the transistor 22. After the switch 24 is rendered non-conductive at a certain timing after the capacitor 23 is charged, the voltage across the capacitor 23 causes continuous flow of a certain current Icomp through the NMOS transistor 22.

The current Icomp is given by $\alpha \times$Icellsw, where Icellsw is the current value of the cell current Icell immediately before the switch 24 is rendered non-conductive. The fixed limitation current Icomp is mirrored by the current mirror circuit 30 to the current path 50, thereby performing the above current limitation. The fixed limitation current Icomp has a value in proportion to the cell current Icellsw of a selected memory cell MC at a certain timing. In the forming operation, therefore, a current control reflecting the different characteristics between the cells is possible.

The current mirror circuit 30 includes three PMOS transistors 31 to 33, a switch 34, and a capacitor 35. The three PMOS transistors 31 to 33 are adapted to, when the switch 34 is switched to short-circuit the source and drain of the transistor 31, be current-mirror connected to each other and able to perform the mirror operation. The PMOS transistors 31 to 33 have their sources connected to the input node IN.

The PMOS transistors 31 to 33 have their gates commonly connected to the node N1. The PMOS transistor 32 has its drain connected to the source of the PMOS transistor 12 at a node N2$a$. The PMOS transistor 33 has its drain connected to the source of the PMOS transistor 11 at a node N2$b$.

The PMOS transistor 31 has its drain connected to the drain of the transistor 22 at a node N3. The switch 34 is connected between the gate and drain of the transistor 31.

The switch 34 rendered conductive starts the mirror operation of the current mirror circuit 30. The limitation current Icomp may thus flow into the current path 50 including the transistors 33 and 11. The capacitor 35 is connected between the node N1 and the ground terminal.

The forming operation of the semiconductor memory device will now be described.

In the initial state before starting the forming operation, the switches 24 and 34 are both in the off-state and the capacitors 23 and 35 are in the discharge state.

When the switch 24 is turned on from the initial state and the voltage Vform necessary for the forming operation starts to be applied to the input terminal IN, the transistor 11 starts to conduct the cell current Icell. The current Icell is then mirrored to the transistor 12. The current Icell further flows into the transistor 21. The current Icell is mirrored to the transistor 22 of $\alpha$ times the size of the transistor 21, and the current Icomp ($=\alpha$*Icell) flows through the transistor 22.

Then, after the capacitor 23 is charged to a certain voltage across it, the switch 24 is turned off and the switch 34 is turned on at a certain timing. After that, the current Icomp ($=\alpha$*Icellsw) according to the voltage across the capacitor 23 keeps flowing through the transistor 22. The current Icomp flows into the transistor 31. The current Icomp is also mirrored to the transistors 32 and 33 via the ON switch 34. For a certain period after that, the cell current Icell is controlled not to exceed the limitation current Icomp=$\alpha$*Icellsw.

After the elapse of a certain period, if the completion of the forming operation is not confirmed, the switch 24 is turned on again for a certain period while the switch 25 is turned off. After the switch 24 is turned on again, the cell current Icell newly generates a limitation current Icomp. Specifically, a limitation current Icomp is newly generated that has $\alpha$ times the current value of the cell current Icell after the switch 24 is turned on again. After that, the switch 24 is turned off again (while the switch 25 is turned on), and according to the cell current Icellsw immediately before the switch 24 is turned off, the value of the limitation current Icomp is newly determined. According to the newly set limitation current Icomp, the current limitation is performed. After that, the above procedure is repeated until the completion of the forming operation of the memory cell is sensed.

The limitation current Icomp has a large value, when a memory cell MC that has a low resistance and thus conducts a large cell current Icell is selected for the forming operation. Conversely, the limitation current Icomp has a small value, when a memory cell MC that has a high resistance and thus conducts only a small cell current Icell is selected.

Additionally, in this embodiment, as described above, after the limitation current Icomp having a constant ($\alpha$) times the cell current Icell of the memory cell is used to perform the forming operation for a certain time period, if it is sensed that the forming operation is uncompleted, the cell current Icell is sensed again and the sensed cell current Icell is used to set the limitation current Icomp again for the forming operation.

Now consider the case where the fixed limitation current is set unlike this embodiment where the limitation current is set according to the characteristics of the memory cells. In this case, the limitation current needs to be stepped up by a small step-up width according to the variation degree. This may increase the time for the forming operation, resulting in high cost.

In this embodiment, however, the limitation current may be set according to the different characteristics of the cells, and the forming operation may be performed appropriately in a short time, without a memory cell breakdown and so on.

[Fifth Embodiment]

Figure 12:
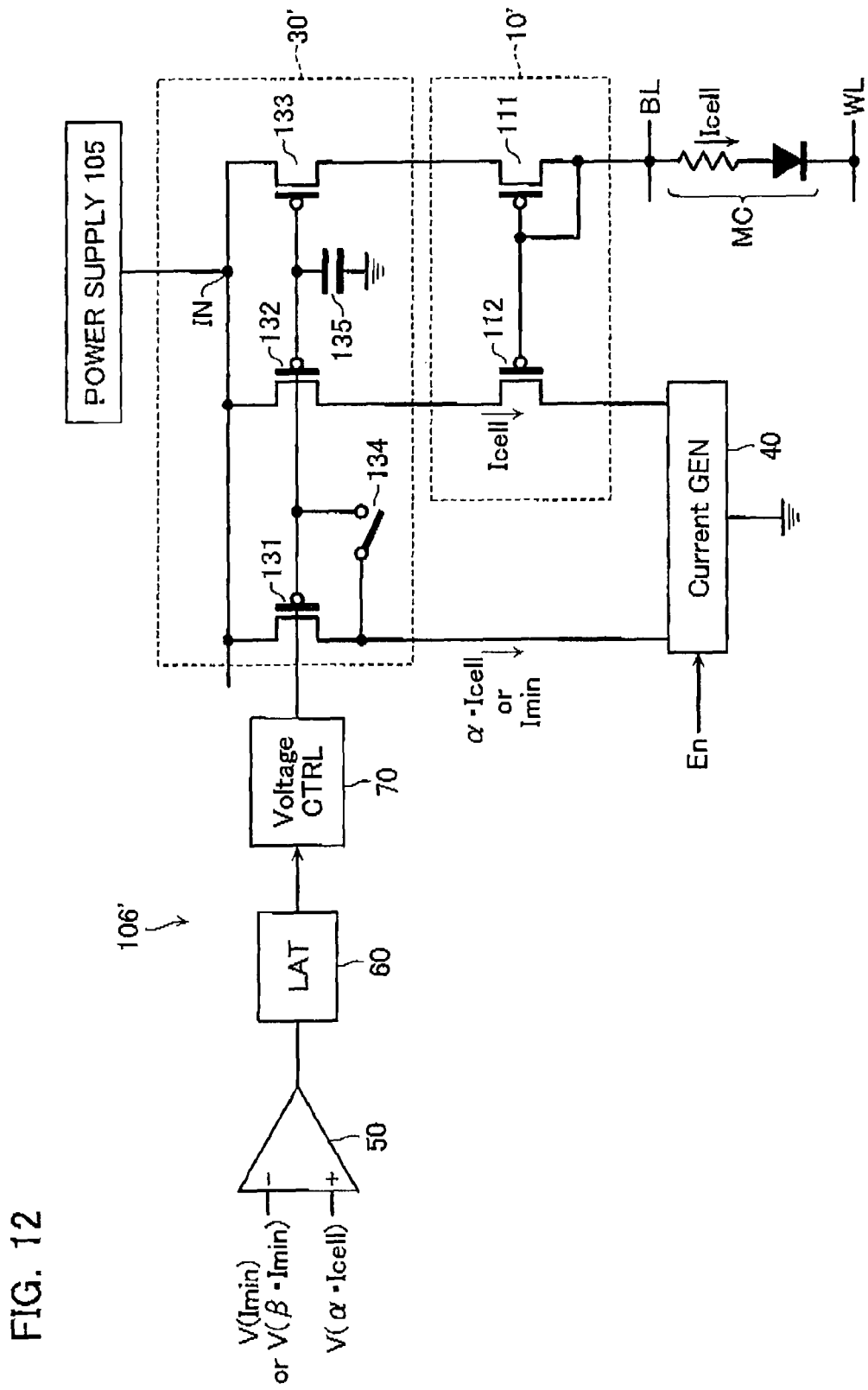
FIG. 12 is an equivalent circuit diagram of a specific example configuration of the current limitation circuit 106 according to a fifth embodiment.

Referring now to FIG. 12, a fifth embodiment will be described below. The entire configuration of a semiconductor memory device according to the fifth embodiment is the same as that in the fourth embodiment. Note, however, that this embodiment includes a current limitation circuit 106' different from the current limitation circuit 106 in the fourth embodiment.

FIG. 12 is an equivalent circuit diagram of the configuration of the current limitation circuit 106' in this embodiment.

The current limitation circuit 106' uses, immediately after the start of the forming operation and when the cell current Icell is still small, the fixed current Imin as the limitation current instead of the limitation current Icomp=α*Icell generated according to the cell current Icell. In this regard, this embodiment is different from the first embodiment in which the limitation current is always the limitation current Icomp (=α*Icellsw) generated according to the cell current Icell.

With reference to FIG. 12, the current limitation circuit 106' includes current mirror circuits 10' and 30', a current generation circuit 40, a differential amplification circuit (OP amplifier) 50, a latch circuit 60, and a voltage control circuit 70.

The current mirror circuits 10' and 30' have the same structures as the current mirror circuits 10 and 30, respectively, in the first embodiment. Transistors 111, 112, 131 to 133, a switch 134, and a capacitor 135 in FIG. 12 correspond to the transistors 11, 12, 31 to 33, the switch 34, and, the capacitor 35 in FIG. 11, respectively.

The current generation circuit 40 generates, in response to an enable signal En, the limitation current Icomp (=α*Icellsw) according to the cell current Icell. The current generation circuit 40 may have the same configuration as the current mirror circuit 20 in FIG. 11.

The OP amplifier 50 has a first input terminal receiving a voltage V (Imin) generated according to the fixed current Imin or a voltage V (β*Imin) generated according to the current β*Imin having a constant (β) times the current value of the fixed current Imin. The OP amplifier 50 has a second input terminal receiving a voltage V (α*Icell) generated according to the limitation current Icomp (=α*Icomp). The OP amplifier 50 differentially amplifies the voltages of the two input terminals and outputs the differential amplification signal.

The latch circuit 60 latches data "1" or "0" according to the differential amplification signal from the OP amplifier 50.

The voltage control circuit 70 switches, according to data held in the latch circuit 60, the voltage to be generated.

Figure 13:
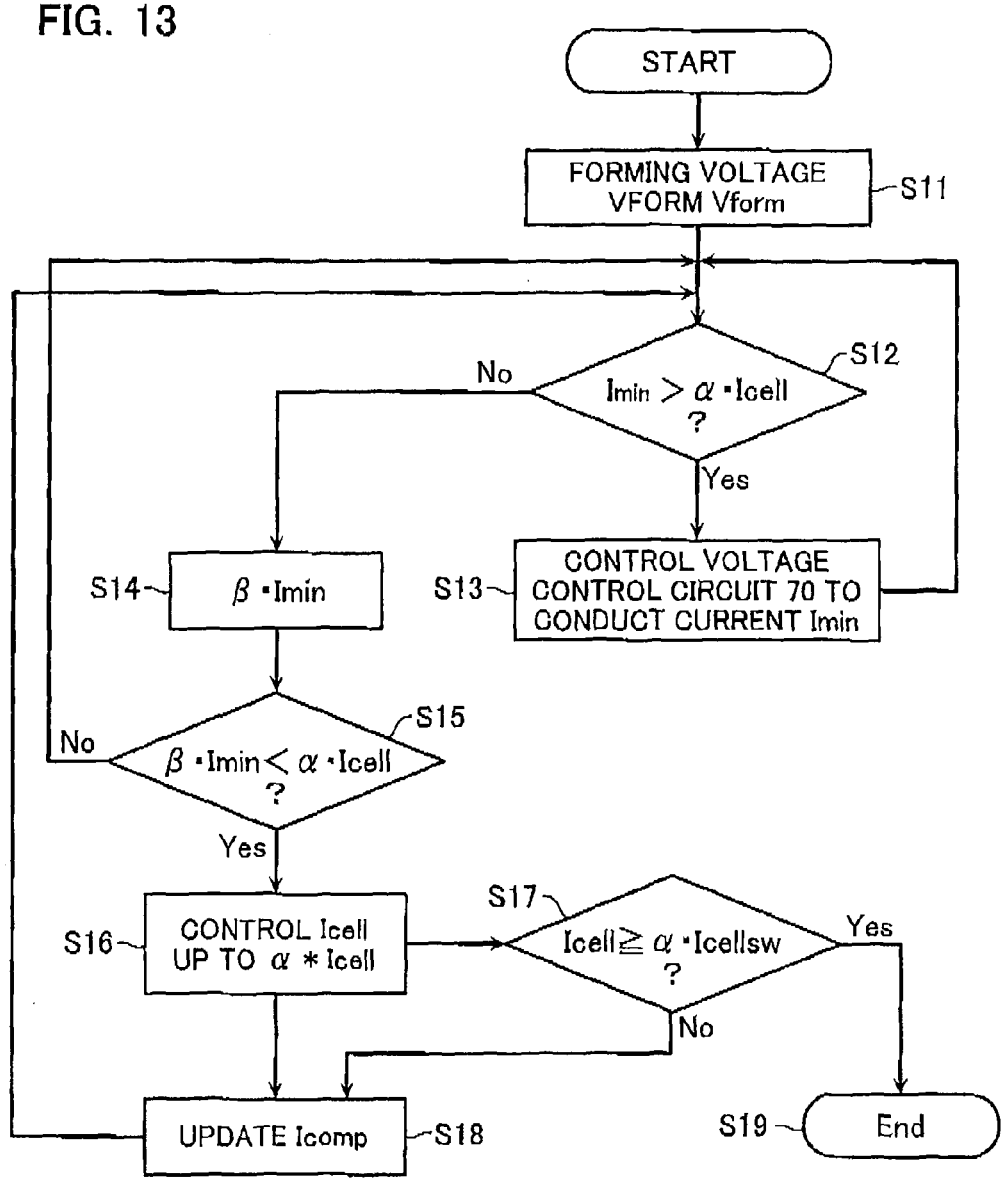
FIG. 13 is a flowchart of the operation according to the fifth embodiment.

Referring now to a flowchart in FIG. 13, a procedure for the forming operation using the current limitation circuit 106' will be specifically described.

First, the voltage Vform necessary for the forming operation is applied to the bit-line 4 via the column decoder 103 (S11). The word-line WL is applied with for example the ground voltage VSS (0 V). A voltage is thus applied across a memory cell MC, thereby conducting the cell current Icell through the memory cell MC. The cell current Icell is mirrored from the transistor 111 to the 112, and is transformed by the current generation circuit 40 into the limitation current Icomp (=α*Icell).

In the initial starting of the forming operation, the cell current Icell is very small. The limitation current Icomp (=α*Icell) generated according to the small cell current Icell is thus too small to perform as the upper limit of the cell current Icell. In this embodiment, therefore, the OP amplifier 50 determines whether Imin>α*Icell (S12). If so, the fixed current Imin is used as the limitation current (S13). Specifically, the voltage from the voltage control circuit 70 is controlled to conduct the fixed current Imin through the transistors 131 to 133.

After that, the forming operation progresses and when the cell current Icell increases until Imin≦α*Icell, instead of the fixed current Imin, a smaller fixed current β*Imin (β<1, for example, β=about 0.75) is used as the comparison reference with the α*Icell (S14). Specifically, instead of the voltage V (Imin), the voltage V (βImin) is input to one of the input terminals of the OP amplifier 50.

After that, if the α*Icell keeps larger than the β*Imin, the α*Icell is used as the limitation current to control the cell current Icell (S16). If the α*Icell falls below the β*Imin, the process returns to S13 and repeats the above control. Note that the current a*Icell will be switched to the fixed value α*Icellsw at a certain point of time.

After that, if the cell current Icell reaches the limitation current α*Icellsw, the forming operation is recognized to be completed and the process ends (S17, S19).

If the cell current Icell does not reach the α*Icellsw within a certain time, according to the cell current Icell at that point, the limitation current Icomp is reset (the limitation current Icomp is updated) (S18), and the same operations are repeated from S12.

In this way, the fixed current as the comparison reference may be switched from the current Imin to the current β*Imin to avoid the situation where the limitation current Icomp is frequently switched between the current β*Icell generated according to the cell current Icell and the fixed current Imin. Note that if it is expected that the cell current Icell oscillates less frequently and almost monotonically increases, the switching may be replaced with continuous comparison between the fixed current Imin and the α*Icell by the OP amplifier 50.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

What is claimed is:

1. A non-volatile semiconductor memory device comprising:
    a memory cell array including memory cells, the memory cells each including a variable resistance element and disposed between a plurality of first wirings and a plurality of second wirings, respectively;

a column decoder configured to select any one of the first wirings;

a row decoder configured to select any one of the second wirings;

a control circuit configured to provide selected one of the first wirings with a first voltage and provide selected one of the second wirings with a second voltage having a lower voltage value than the first voltage so as to apply a certain potential difference to a selected memory cell disposed between one of the first wirings selected by the column decoder and one of the second wirings selected by the row decoder, and a current limitation circuit configured to control a cell current flowing through the selected memory cell not to exceed a first current, the current limitation circuit comprising:

a first current generation circuit configured to store a cell current at a first point of time as a stored current and generating a first current having a current value of α times the current value of the stored current;

a second current generation circuit configured to generate a second current having a current value of $(\beta/\alpha)(\alpha > \beta)$ times the current value of a cell current at a second point of time after the first point of time; and a determination circuit for outputting a control signal when it is determined that the current value of the second current exceeds the current value of the stored current, the first current generation circuit newly storing a stored current at a timing according to the control signal.

2. The non-volatile semiconductor memory device according to claim 1, wherein the current limitation circuit stops voltage supply to the memory cell when the current value of a cell current reaches a certain upper limit.

3. The non-volatile semiconductor memory device according to claim 2, wherein the first current generation circuit comprises:

a first transistor configured to conduct a cell current;

a second transistor minor-connected to the first transistor, the second transistor having α times the size of the first transistor;

a first capacitor having a first end and a second end, the first end being connected to the gates of the first transistor and the second transistor, the second end being connected to a fixed potential end terminal; and a first switch configured to switch between short-circuit and disconnection between the drain and the gate of the first transistor, the first switch being rendered conductive according to the control signal to short-circuit the drain and the gate.

4. The non-volatile semiconductor memory device according to claim 3 further comprising:

a third transistor configured to conduct the first current;

a fourth transistor mirror-connected to the third transistor, and configured to conduct a cell current;

a second capacitor having a first end and a second end, the first end being connected to the gates of the third transistor and the fourth transistor, the second end being connected to a fixed potential end terminal; and a second switch connected so as to disconnect the mirror connection between the third transistor and the fourth transistor, the second switch operating according to the control signal.

5. The non-volatile semiconductor memory device according to claim 4, wherein the second current generation circuit comprises:

a fifth transistor configured to conduct a cell current; and a sixth transistor mirror-connected to the fifth transistor, the sixth transistor having $(\beta/\alpha)$ times the size of the fifth transistor.

6. The non-volatile semiconductor memory device according to claim 5, wherein the determination circuit comprises:

a seventh transistor diode-connected between the sixth transistor and a fixed potential end terminal; and a comparison circuit for comparing a voltage of the first end of the first capacitor with the gate voltage of the seventh transistor.

7. The non-volatile semiconductor memory device according to claim 6, further comprising a latch circuit for latching an output signal of the comparison circuit.

8. The non-volatile semiconductor memory device according to claim 1, wherein the first current generation circuit comprises:

a first transistor configured to conduct a cell current;

a second transistor mirror-connected to the first transistor, the second transistor having α times the size of the first transistor;

a first capacitor having a first end and a second end, the first end being connected to the gates of the first transistor and the second transistor, the second end being connected to a fixed potential end terminal; and a first switch configured to switch between short-circuit and disconnection between the drain and the gate of the first transistor, the first switch being rendered conductive according to the control signal to short-circuit the drain and the gate.

9. The non-volatile semiconductor memory device according to claim 8, further comprising:

a third transistor configured to conduct the first current;

a fourth transistor mirror-connected to the third transistor, and configured to conduct a cell current;

a second capacitor having a first end and a second end, the first end being connected to the gates of the third transistor and the fourth transistor, the second end being connected to a fixed potential end terminal; and a second switch connected so as to disconnect the mirror connection between the third transistor and the fourth transistor, the second switch operating according to the control signal.

10. The non-volatile semiconductor memory device according to claim 9, wherein the second current generation circuit comprises:

a fifth transistor configured to conduct a cell current; and a sixth transistor mirror-connected to the fifth transistor, the sixth transistor having $(\beta/\alpha)$ times the size of the fifth transistor.

11. The non-volatile semiconductor memory device according to claim 1, further comprising:

a third transistor configured to conduct the first current;

a fourth transistor mirror-connected to the third transistor, and configured to conduct the cell current;

a second capacitor having a first end and a second end, the first end being connected to the gates of the third transistor and the fourth transistor, the second end being connected to a fixed potential end terminal; and a second switch connected so as to disconnect the mirror connection between the third transistor and the fourth transistor, the second switch operating according to the control signal.

12. The non-volatile semiconductor memory device according to claim 1, wherein
the second current generation circuit comprises:
a fifth transistor configured to conduct a cell current; and
a sixth transistor minor-connected to the fifth transistor, the sixth transistor having ($\beta/\alpha$) times the size of the fifth transistor.

13. A non-volatile semiconductor memory device comprising:
a memory cell array including memory cells, the memory cells each including a variable resistance element and disposed between a plurality of first wirings and a plurality of second wirings, respectively;
a control circuit configured to provide the memory cell with a voltage necessary for a forming operation of the memory cell via the first and the second wirings; and
a current limitation circuit connected to the first wiring, the current limitation circuit configured to limit a cell current flowing through the memory cell to a certain limit value in the forming operation,
the current limitation circuit generating a first current larger than the cell current at a certain point of time by a certain ratio, the current limitation circuit controlling a cell current to not more than the first current,
wherein the current generation circuit comprises:
a first transistor configured to conduct a cell current;
a second transistor minor-connected to the first transistor, and configured to generate the first current;
a capacitor having a first end and a second end, the first end connected to the gates of the first transistor and the second transistor, the second end connected to a fixed potential end terminal; and
a first switch configured to switch between short-circuit and disconnection between the drain and the gate of the first transistor, the first switch being rendered non-conductive at a certain timing to disconnect the drain and the gate.

14. The semiconductor memory device according to claim 13, further comprising:
a third transistor connected in series with the second transistor, the third transistor being adapted to conduct the first current;
a second switch configured to switch between short-circuit and disconnection between the drain and the gate between the third transistor; and
a fourth transistor mirror-connected to the third transistor,
a cell current being controlled such that an upper limit value thereof is a current flowing through the fourth transistor.

15. The semiconductor memory device according to claim 14, wherein
the second switch is adapted to be switched to a conductive state after the first switch is rendered non-conductive.

16. The semiconductor memory device according to claim 14, further comprising a capacitor having a first end and a second end, the first end being connected to the gate of the fourth transistor, the second end being connected to a fixed potential end terminal.

17. The semiconductor memory device according to claim 16, further comprising a comparison circuit configured to compare the first current with a fixed second current,
wherein the control circuit controls, according to the comparison result of the comparison circuit, one of the first current and the second current to flow through the fourth transistor.

18. The semiconductor memory device according to claim 17, wherein
the second switch is adapted to be switched to a conductive state after the first switch is rendered non-conductive.

* * * * *